United States Patent
Li et al.

(10) Patent No.: US 9,263,459 B1
(45) Date of Patent: Feb. 16, 2016

(54) CAPPING POLY CHANNEL PILLARS IN STACKED CIRCUITS

(71) Applicants: Hongqi Li, Boise, ID (US); Gowrisankar Damarla, Boise, ID (US); Roger Lindsay, Boise, ID (US); Zailong Bian, Boise, ID (US); Jin Lu, Boise, ID (US); Shyam Ramalingam, Boise, ID (US); Prasanna Srinivasan, Boise, ID (US)

(72) Inventors: Hongqi Li, Boise, ID (US); Gowrisankar Damarla, Boise, ID (US); Roger Lindsay, Boise, ID (US); Zailong Bian, Boise, ID (US); Jin Lu, Boise, ID (US); Shyam Ramalingam, Boise, ID (US); Prasanna Srinivasan, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/498,673

(22) Filed: Sep. 26, 2014

(51) Int. Cl.
| | |
|---|---|
| H01L 21/8226 | (2006.01) |
| H01L 21/331 | (2006.01) |
| H01L 21/8222 | (2006.01) |
| H01L 21/336 | (2006.01) |
| H01L 29/66 | (2006.01) |
| H01L 27/115 | (2006.01) |

(52) U.S. Cl.
CPC .... *H01L 27/11524* (2013.01); *H01L 27/11529* (2013.01); *H01L 27/11556* (2013.01)

(58) Field of Classification Search
CPC .............. H01L 27/115; H01L 21/8221; H01L 27/0688; H01L 27/11551; H01L 27/11556; H01L 27/11578; H01L 27/11582; H01L 27/1052; H01L 29/7832
See application file for complete search history.

(56) References Cited

U.S. PATENT DOCUMENTS

| | | | | |
|---|---|---|---|---|
| 4,920,065 | A * | 4/1990 | Chin | .................... H01L 21/3065 257/302 |
| 2009/0159964 | A1* | 6/2009 | Lee | ...................... H01L 29/7827 257/329 |
| 2015/0106777 | A1* | 4/2015 | Tsai | .................... G06F 17/5072 716/119 |

* cited by examiner

*Primary Examiner* — Mohsen Ahmadi
(74) *Attorney, Agent, or Firm* — Vincent Anderson Law PC

(57) ABSTRACT

A three dimensional or stacked circuit device includes a conductive channel cap on a conductor channel. The channel cap can be created via selective deposition or other process to prevent polishing down the conductive material to isolate the contacts. The conductor channel extends through a deck of multiple tiers of circuit elements that are activated via a gate. The gate is activated by electrical potential in the conductor channel. The conductive cap on the conductor channel can electrically connect the conductor channel to a bitline or other signal line, and/or to another deck of multiple circuit elements.

18 Claims, 17 Drawing Sheets

CAPPING POLY CHANNEL PILLARS IN STACKED CIRCUITS

FIELD

Embodiments of the invention are generally related to stacked circuit devices, and more particularly to creating stacked circuit poly channel pillar caps.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2014, Intel Corporation, All Rights Reserved.

BACKGROUND

As an approach to meet increasing demand for smaller and higher performance computing device, there has been an exploration of three dimensional (3D) or stacked fabrication of circuit devices. In particular, there has been research on stacking memory devices to increase storage capacity in smaller footprints and provide higher performance. Traditional processing techniques require a minimum amount of size for circuit devices limited by the amount of real estate required to implement the circuit elements. Traditional practice in stacked circuits has been to create a conductor to contact a channel through a deck of circuit elements by depositing the conductor, and then isolate specific contacts by CMP (chemical mechanical processing).

Current CMP results in undesired processing artifacts. A processing artifact refers to an imperfection in the circuit resulting from the processing. Thus, evidence of over-etching, over-ablation, scratching from polishing, thinning of a separation layer, or other evidence can be referred to as a processing artifact. In addition to processing artifacts created by the circuit processing, the chemicals and processes needed are dependent on the material used as the conductor layer. Currently finding a good chemical process to provide good contact isolation is challenging, in addition to the leaving of processing artifacts. Such challenges currently extend the time needed to process the circuits, and increase the cost of the processing. The relatively high cost and time requirements limit the commercial viability for high volume manufacturing.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figures 1A, 1B:
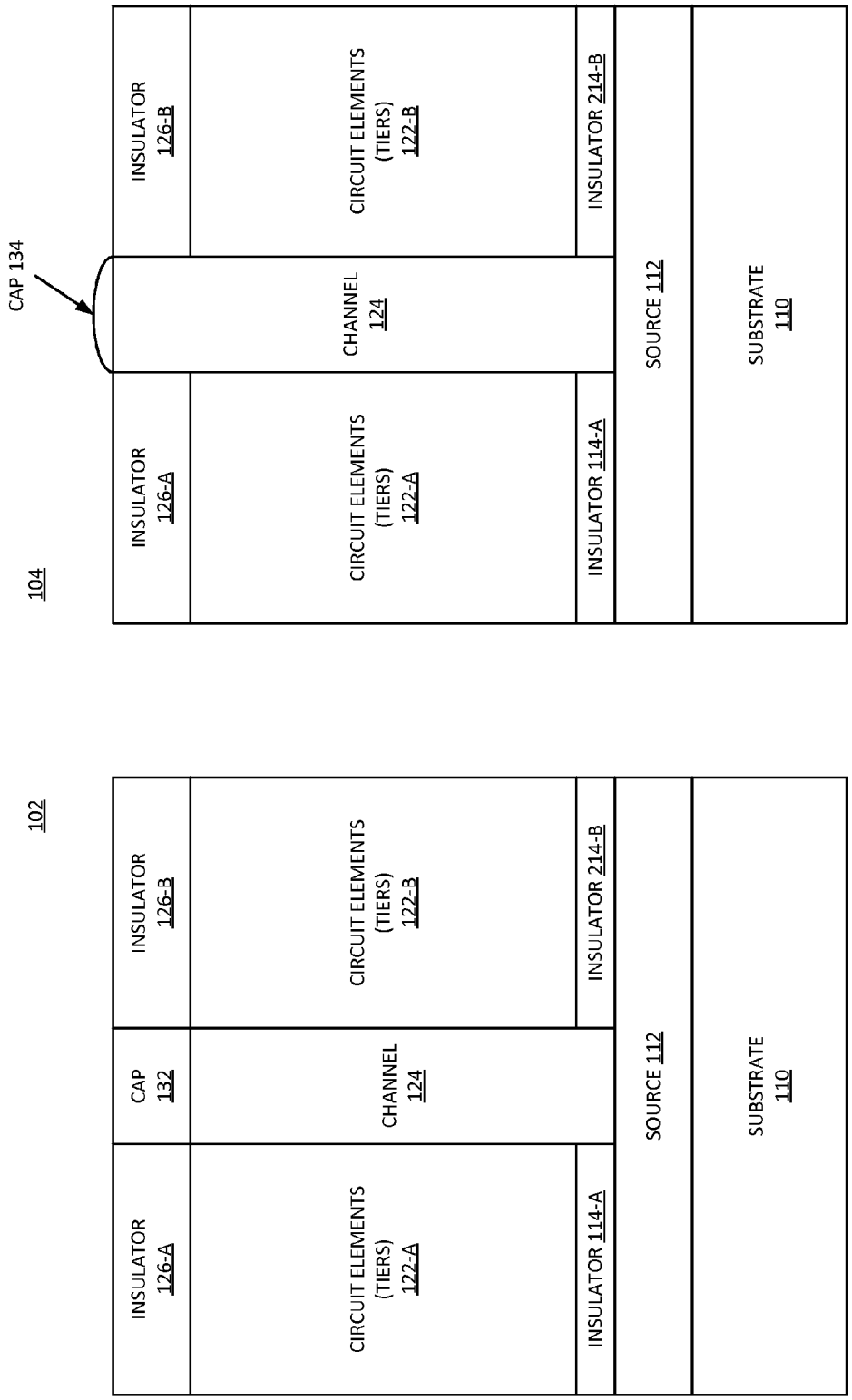
FIGS. 1A-1B are block diagrams of embodiments of a stacked circuit having a selectively created channel cap.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a three dimensional or stacked circuit device includes a selectively grown conductive channel cap on a conductor channel. The channel cap can be created via selective deposition or other process to prevent depositing extra material and then polishing it down. Thus, the channel cap can be created without leaving polishing artifacts. The conductor channel extends through a deck of multiple tiers of circuit elements that are activated via a gate. The gate is activated by electrical potential in the conductor channel via connection to a source. The channel cap on the conductor channel can electrically connect the conductor channel to a bitline or other signal line, and/or to another deck of multiple circuit elements.

In contrast to current best known methods, the selective deposition of the channel cap material can simplify the circuit processing. The processing can reduce the number of process operations, which reduces cost and time. Additionally, by eliminating at least one polishing process, the processing can eliminate at least one source of processing artifacts. More specifically, the selective channel cap processing described herein can reduce or eliminate the scratching from polishing and the thinning or loss of a separation layer that caps the circuit device. Another artifact that can be introduced by polishing is surface contamination which is reduced or eliminated in accordance with what is described herein. Surface contamination can refer to contaminants (other material) introduced into the separation layer and/or the channel cap due to the polishing process. It will be understood that reference to eliminating a polishing artifact can refer to just the artifacts that might occur for the specific traditional CMP operation that isolates the channel contacts. As described herein, the channel caps are the channel contacts, and they are selectively created. In one embodiment, they are created isolated and there is no need to perform polishing to isolate the channel contacts. Thus, while one or more CMP operations can be eliminated, the processing of the circuit device may still use other CMP operations for processes other than the process of creating and/or isolating the channel cap contacts.

In one embodiment, the processing can be controlled for a desired thickness of the channel cap. For applications where a thin contact layer is sufficient, the processing can simply selectively deposit the channel cap material onto the exposed channels. In one embodiment, where a thicker contact layer is desired, the processing can etch or otherwise recess openings in the separate layer and/or in the conductor channel. The processing then selectively deposits the channel cap material, which can fill the recess for a thicker layer. The recessing process can be controlled for any desired amount of recess and corresponding thickness of channel cap. It will be understood that a deeper recess may require additional processing time in channel cap deposition to create the desired thickness.

In one embodiment, the circuit elements in the multiple tiers or decks of multiple tiers are NAND memory cells. Thus, the circuit device can be a three dimensional (3D) memory device. In one embodiment, the selective channel cap deposition allows the creation of an inter-deck contact. Thus, the circuit elements or memory elements can be created with more tiers than current processing dimension and chemistry would otherwise permit, but separately processing different decks of multiple tiers stacked adjacent to each other. The adjacent decks can be connected by a selectively created channel cap in accordance with any embodiment described herein.

The following descriptions refer to the accompanying drawings. It will be understood that the drawings do not necessarily set out elements or components to scale. Certain elements are intentionally drawn out of proportion for purposes of illustration and discussion. It will also be understood that specific examples refer to vertical stacking of decks, one on top of the other. In one embodiment, the circuits could be configured horizontally. Adjacent and stacked decks can thus refer to horizontal and/or vertical stacking.

FIGS. 1A-1B are block diagrams of embodiments of a stacked circuit having a selectively created channel cap. FIG. 1A illustrates circuit 102 which has a recess in which the channel cap is selectively created. FIG. 1B illustrates circuit 104 where the channel cap is selectively created on a non-recessed channel.

Circuit 102 represents a cross section of an electronic circuit, and it will be understood that typically many such circuits would be processed simultaneously on a semiconductor wafer. Substrate 110 represents a substrate or semiconductor platform on which the electronic circuit is processed. Substrate 110 is typically part of the wafer for processing. The processing creates (e.g., deposits) source conductor 112 on or in substrate 110. Source conductor 112 can activate or control the circuit operation of circuit elements 122 of circuit 102. Source conductor 112 includes a highly conductive (low resistivity) material, such a metallic material or other material with many high-mobility carriers. In one embodiment, source 112 is a multilayer structure. It will be understood that not all circuit elements for a functional circuit are illustrated in circuit 102.

Insulator 114 (elements 114-A and 114-B) can provide a barrier between source 112 and the multiple tiers of circuit elements 122 (elements 122-A and 122-B). The processing creates circuit elements 122 in tiers, such as by iteratively processing multiple layers of devices adjacent to each other. Typically, the functional circuit elements are separated by a layer of insulator between each tier of circuit elements. Channel 124 represents a common conductor for circuit elements 122, and extends the entire height/length of circuit elements 122 to source 112. Thus, channel 124 provides electrical connectivity from source 112 to circuit elements 122.

In one embodiment, the processing creates insulator 126 (elements 126-A and 126-B) on circuit elements 122 to provide a separation layer between circuit elements 122 and additional elements that may be processed on circuit 102. Such additional elements can include one or more additional decks of multiple tiers of circuit elements, signaling lines, and/or other elements. The processing creates channel cap 132 at the end of channel 124, and allows electrical connectivity of channel 124 to elements processed on circuit 102, and thus enables electrical connectivity of additional elements (not shown) to source 112. It will be understood that insulator 126 can be a single insulator layer that surrounds channel cap 132. Similarly, channel 124 can be surrounded by circuit elements 122. Thus, the designation of 'A' and 'B' elements is merely for illustrative purposes for the illustrated cross section, to illustrate the different sides of the circuit as seen from a cross section.

In one embodiment, the depth of recess for channel cap 132 can be controlled for different applications. In one embodiment, the processing does not perform any recessing for the channel cap, as illustrated in circuit 104. Circuit 104 is labeled with similar components as circuit 102, and the descriptions above apply similarly to the referenced components of circuit 104. Channel cap 134 is illustrated as rounded or extending beyond the plane of insulator 126. Thus, channel cap 134 could be referred to as a 'button' cap or a 'mushroom' cap, referring to the rounded feature of the channel cap.

Channel caps 132 and 134 include a metallic material to be highly conductive. In one embodiment, the material is a metal, which could be but is not limited to tungsten (W), titanium (Ti), cobalt (Co), or others. In one embodiment, the material includes a metal silicide, which could be but is not limited to tungsten silicide (WSix), titanium silicide (TiSix), cobalt silicide (CoSix), or others. In one embodiment, the material includes a metal oxide, which could be but is not limited to titanium oxide (TiOx), cobalt oxide (CoOx), zinc oxide (ZnOx), zirconium oxide (ZrOx), hafnium oxide (HfOx), or others. Each of the metals, metal nitrides, and metal oxides can be selectively grown on channel 124. In one embodiment, channel 124 includes highly doped polysilicon, which provides the ability to selectively grow material with known techniques (techniques for selective metallic growth on silicon).

It will be understood that chemical formula representations such as WSix or TiOx (and others used herein) are generic representations of a chemical compound rather than a specific chemical formula. Each representation refers to a metal or metallic atom as the first element with at second element following. The 'x' at the end of the chemical formula representation indicates that the compound will include one or more of the first atom combined with one or more of the second atom. The exact numbers of each atom of the various compounds could vary by implementation and/or processing technique, and is thus not specified herein.

Figure 2:
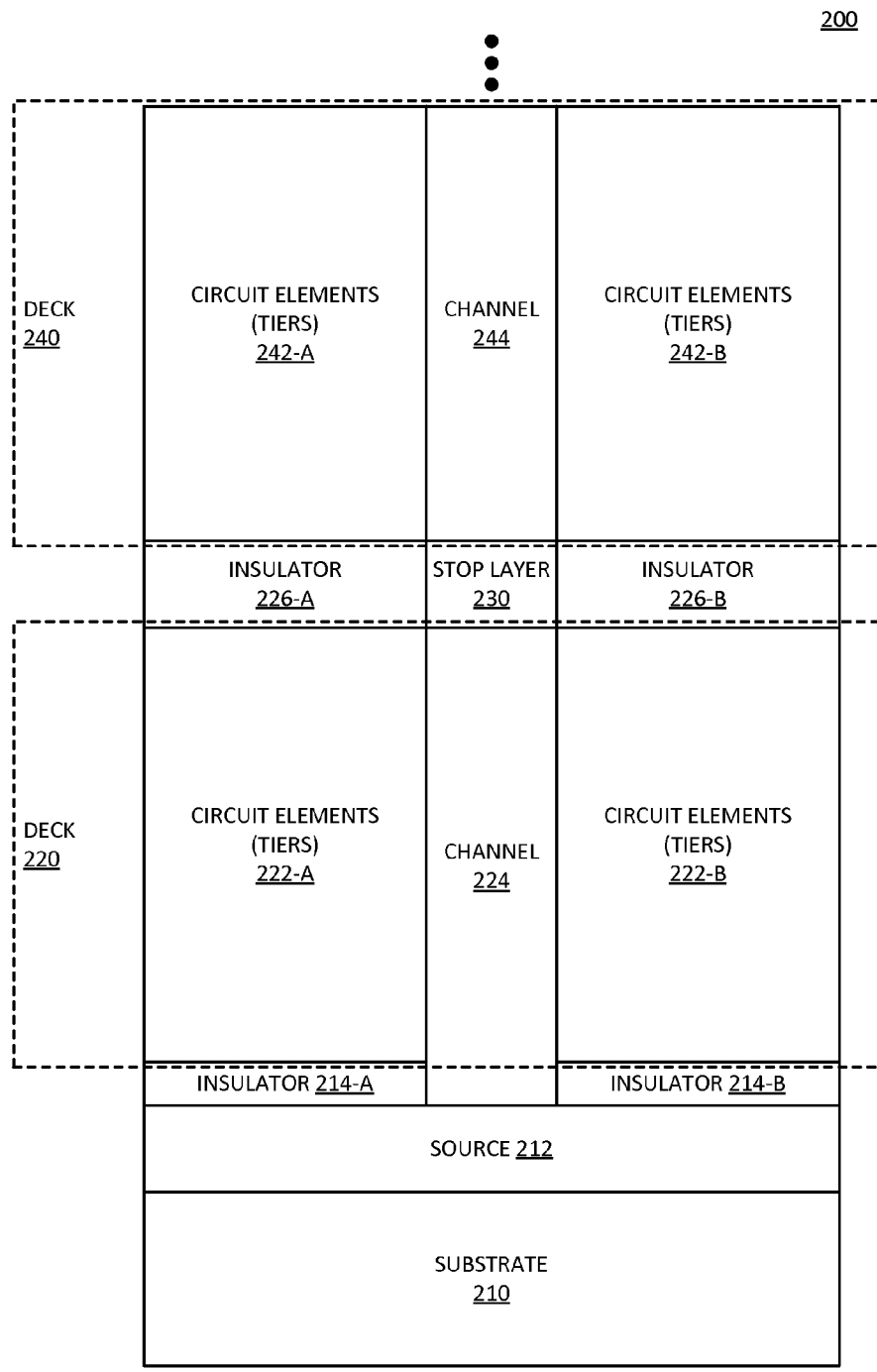
FIG. 2 is a block diagram of an embodiment of a stacked circuit in which a selectively created channel cap provides a stop layer between decks of circuit elements.

FIG. 2 is a block diagram of an embodiment of a stacked circuit in which a selectively created channel cap provides a stop layer between decks of circuit elements. Circuit 200 represents a portion of an electronic circuit device that uses multiple decks of circuit elements, and can be a circuit in accordance with either 102 or 104 of FIGS. 1A and 1B. Instead of processing all circuit elements in a single 3D stack and attempting to create a channel to activate all the circuit elements, the processing creates circuit 200 in layers, with multiple decks of circuit elements.

Substrate 210 represents a substrate or semiconductor platform on which the electronic circuit is processed. Circuit 200 represents a cross section of the electronic circuit, and it will be understood that what is represented could be merely a small portion of an individual circuit device, and that multiple of the same circuit devices can be processed in parallel. The processing creates (e.g., deposits) source conductor 212 on substrate 210, wherein source 212 provides a source of charge carriers to the conductive channels to enable them to provide an electrical potential to activate the circuit elements.

Insulator 214 (elements 214-A and 214-B) can provide a barrier between source 212 and the first deck, deck 220. Deck 220 includes circuit elements 222 (elements 222-A and 222-B). The processing creates circuit elements 222 in tiers within deck 220. Thus, circuit 200 includes multiple circuit elements 222 stacked adjacent to each other within deck 220. Deck 220 can include anywhere from a few circuit elements 222 to more than 30 circuit elements (e.g., 36 or 38 memory cells), depending on the geometries of circuit 200 and the capabilities of the processing techniques used. Channel 224 extends the entire height/length of deck 220 to source 212, to provide electrical connectivity from source 212 to circuit elements 222.

The processing creates insulator 226 (elements 226-A and 226-B) on deck 220, which is a separation layer for circuit 200. The processing also creates a conductive channel cap that functions as stop layer 230. Stop layer 230 provides electrical connectivity of channel 244 of deck 240 to channel 224 of deck 220, and thus to source 212.

In one embodiment, the processing creates deck 240 as a second deck for circuit 200, adjacent to deck 220. Deck 240 includes circuit elements 242 (elements 242-A and 242-B). It will be understood that the multiple tiers of circuit elements, 222 and 242, can be processed in steps or layers. Thus, the number of tiers desired can determine how many layers of processing are performed. In one embodiment, circuit elements 222 and 242 are each stacked vertically as tiers of circuit elements within their respective decks. In one embodiment, the processing that creates circuit elements 242 is the same as the processing that creates circuit elements 222, but performed in a different deck separated by certain decks processing operations.

In one embodiment, the metallic material used for stop layer 230 and/or the depth of etch to create stop layer 230 provides good conductivity to interconnect channel 244 to channel 224, and can enable a deterministic stopping point for an etch process that creates channel 244. While not specifically shown, channel 244 can also have a channel cap selectively grown on it. In one embodiment, the processing uses different processes to selectively grow the channel cap represented by stop layer 230 and a channel cap on channel 244. For example, the processing can create stop layer 230 as a layer selectively grown in a recess on channel 224, and then create a channel cap on channel 244 as a cap selectively grown on the poly or other material that makes up channel 244. Stop layer 230 provides an ohmic contact between the channel and the conductive material of the channel cap. In one embodiment, the type of channel cap (e.g., recessed and non-recessed) could be reversed for stop layer 230 and a channel cap on channel 244. The processing creates the channel caps as interconnections within the channel and/or as contacts to access a conductive channel. By selectively growing the channel cap, the processing does not require CMP or other processing to isolate the contacts. Instead, the channel caps are prepared as contacts simply by the selective creation process. Thus, the creation of the channel cap does not result in polishing artifacts in circuit 200.

Circuit 200 explicitly illustrates two decks, deck 220 and deck 240. It will be understood that the separation of the elements in the different decks, as well as the high conductivity of channel 224, channel 244, and selectively grown stop layer 230 theoretically allows any number of decks to be stacked in a circuit. Thus, the total number of circuit elements in circuit 200 can be doubled, tripled, or more, relative to what the real estate would traditionally allow, based on the stacking. The use of selective growing of stop layers can provide a more commercially viable process for high volume implementation.

Figure 3:
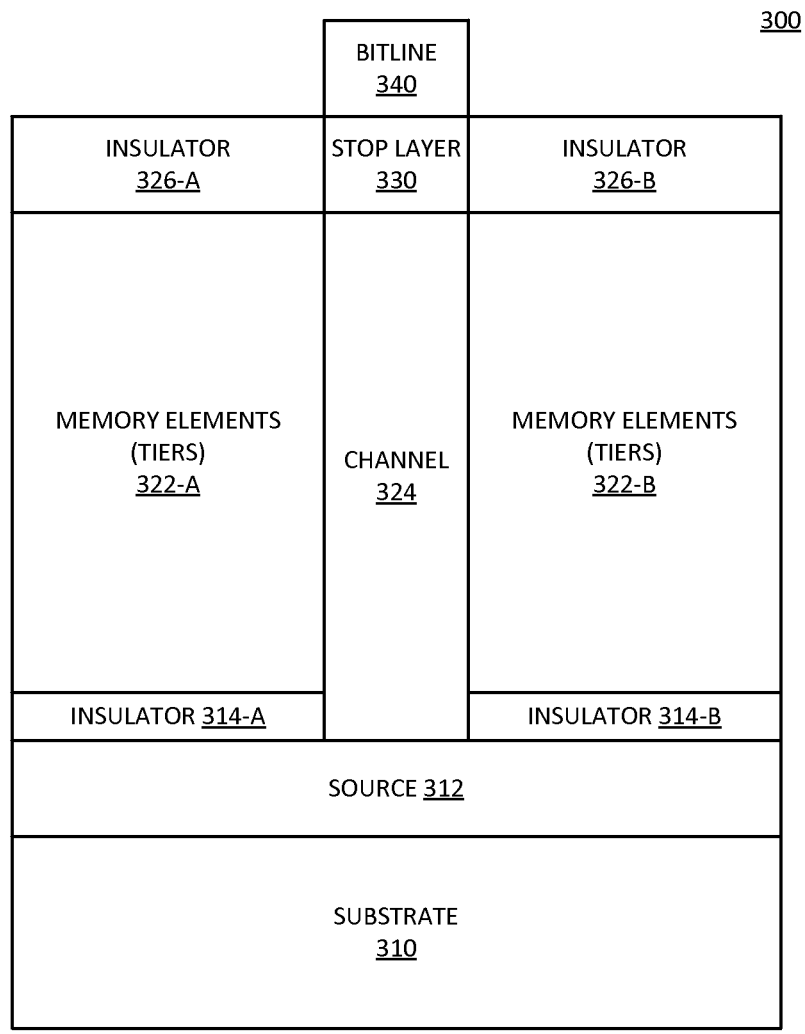
FIG. 3 is a block diagram of an embodiment of a stacked memory circuit in which a selectively created channel cap provides a contact between the channel and a bitline.

FIG. 3 is a block diagram of an embodiment of a stacked memory circuit in which a selectively created channel cap provides a contact between the channel and a bitline. Circuit 300 represents a portion of an electronic circuit device that uses multiple decks of circuit elements, and can be a circuit in accordance with either 102 or 104 of FIGS. 1A and 1B. It will be observed that circuit 300 includes similar elements to those illustrated and described with reference to circuit 200 of FIG. 2. The discussion of components 210, 212, 224, 226, and 230 of circuit 200 applies equally well to components 310, 312, 324, 326, and 330, respectively, of circuit 300. In one embodiment, the circuit elements of circuit 300 are memory elements 322 (elements 322-A and 322-B). Memory elements 322 represent tiers of memory cells configured in a stacked circuit. The 3D configuration of circuit 300 enables greater density for the memory cells.

In one embodiment, stop layer 330 of circuit 300 provides a contact for bitline 340. Bitline 340 can charge memory elements 322 by charging channel 324 via stop layer 330. Thus, stop layer 230 of circuit 200 connects channel 224 to channel 244 of deck 240 processed on deck 220, and stop layer 330 of circuit 300 connects channel 324 to bitline 340. It will be understood that while labeled specifically as a bitline, bitline 340 can represent any signal line that might be connected to channel 324. It will be understood that circuit 300 can include many memory elements 322 in parallel with multiple different channels. Each channel can be connected to different signal lines, or multiple channels can be connected to the same signal lines. In one embodiment, circuit 300 includes a select gate between bitline 340 and stop layer 330.

FIGS. 4A-4G are block diagrams of embodiments of states of a stacked circuit with a selectively created channel cap. For purposes of example, FIGS. 4A-4G illustrate a three-dimensional stacked memory device, with each deck having multiple tiers of memory cells. Specifically, the example in FIGS. 4A-4G provide example embodiments of a vertically stacked memory device, with multiple vertical tiers of memory cells. The circuit states illustrated in FIGS. 4A-4G can apply to any embodiment of a stacked circuit with a channel cap described herein, such as circuits 102, 104, 200, or 300. In one embodiment, the processing will generate another deck of multiple tiers of memory cells vertically adjacent the deck created. In one embodiment, the processing can occur in a "horizontal" manner, but for a device that is stacked out from a semiconductor substrate or wafer. Thus, in one embodiment, "vertical" stacking can refer to any processing that extends circuit elements out or up and away from the semiconductor substrate on which the devices are processed and/or placed for operation. Such processing allows reduced area in a plane of the semiconductor substrate to which the devices are connected, while increasing the number of devices stacked out from the semiconductor substrate.

Figure 4A:
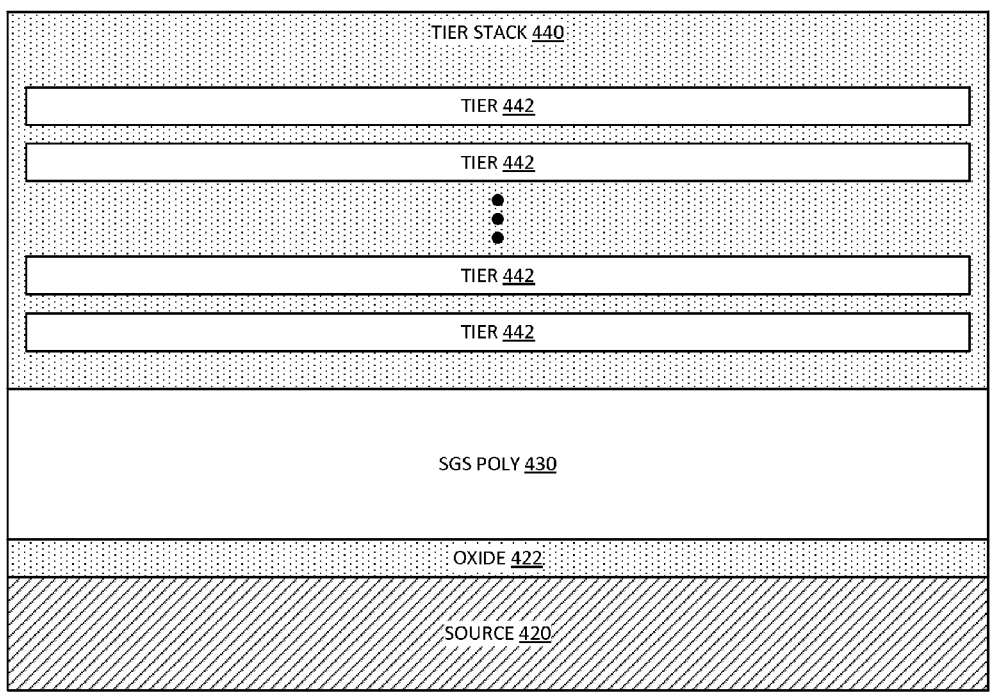
FIGS. 4A-4G are block diagrams of embodiments of states of a stacked circuit with a selectively created channel cap.

FIG. 4A illustrates circuit state 402, in which multiple tiers 442 are processed over source 420. In one embodiment, oxide 422 provides a separation between the metallic material of source 420 and the doped poly material of SGS poly 430. SGS poly 430 represents a select gate that can be used to activate memory cells in tier stack 440. In one embodiment, oxide 422 includes a specific compound, such as a metal oxide, to control etching and contact of a conductive channel to source 420. In one embodiment, tier stack 440 includes oxide as an inter-tier insulator that isolates one tier 442 from another. Stack 440 can include any number of tiers 442. In one embodiment, oxide 422 is the same material as an oxide used as an inter-tier insulator. In one embodiment, oxide 422 is a different material than the oxide use as an inter-tier insulator. For purposes of simplicity, the substrate is not illustrated in circuit state 402, but source 420 will be understood to be processed in or on a substrate.

Figure 4B:
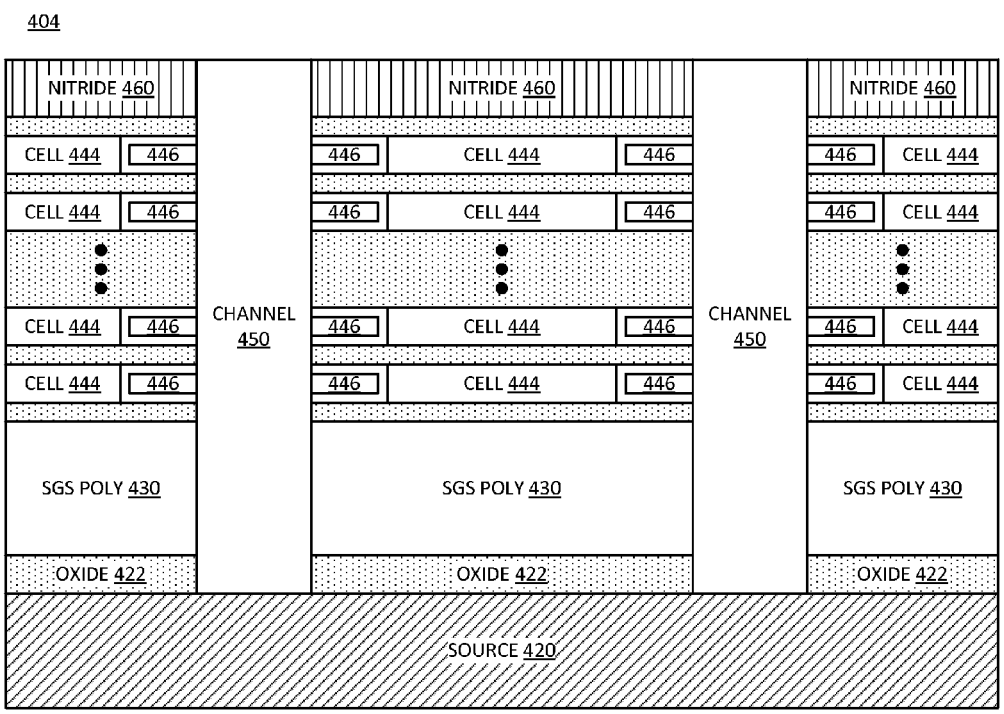

FIG. 4B illustrates circuit state 404, in which the processing creates the hollow channel conductor. In one embodiment, the processing creates channel 450 through the multitier stack of memory elements by creating a punch etch, cleaning the pillar, and depositing a conductor material along the base and sides of the pillar. In one embodiment, channel 450 includes a single conductive material (such as poly), but could alternatively be a poly or metallic material on the base and side that surround an oxide or insulator in the inner part of the channel. As illustrated, channel 450 is a solid channel. Channel 450 extends from one end of the multitier stack down to source 420 to provide ohmic contact with source 420.

Circuit state 404 more specifically labels the multitier stack as cells 444. In one embodiment, each cell 444 includes a floating gate 446 to activate the cell. Gates 446 connect to channels 450, allowing channel 450 to conduct charge that will activate gates 446 to provide access to cells 444. Nitride 460 represents a circuit capping layer, which insulates the multitier stack of memory cells from other processing that will finish the circuit. In one embodiment, nitride 460 is an insulator or insulation layer between the multitier stack of memory cells and another stack or another deck of memory cells processed vertically adjacent the multitier stack shown. Generally, nitride 460 is a non-metal nitride. The physical composition of nitride 460 can be a material that allows growth of a channel cap at the end of the channel without growing the material anywhere on the capping nitride layer.

Figure 4C:
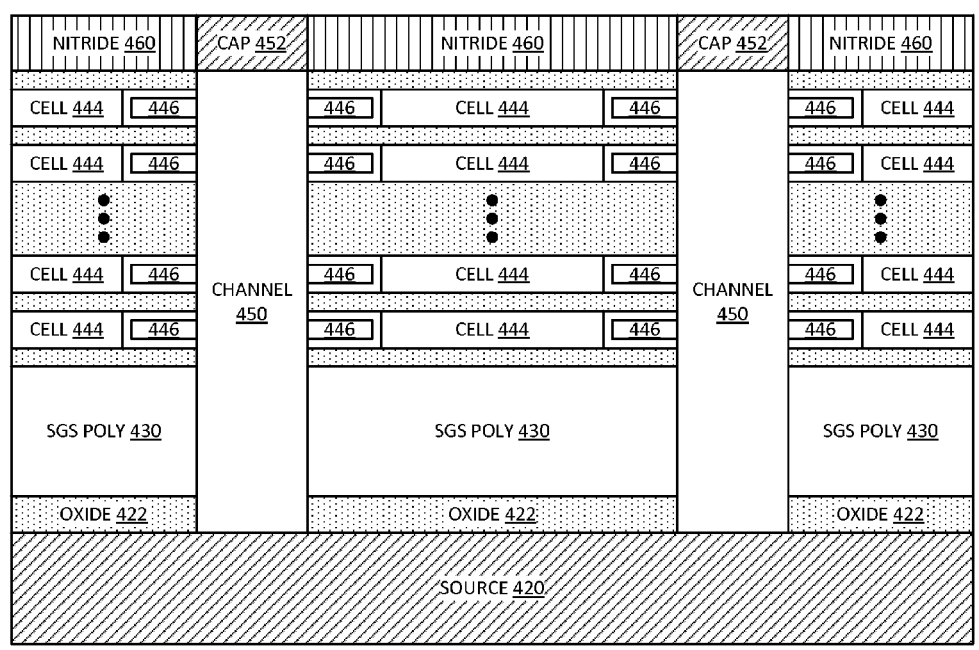

FIG. 4C illustrates circuit state 406, in which the processing creates a channel cap or conductive cap with a recessing operation. The processing first creates a recess via etch or another process, and then fills the recess with the material for cap 452. Cap 452 is selectively grown by a process of selective deposition or other selective operation that can grow or deposit material in one area of the circuit but not another. The recessing of channel 450 causes the exposure of material of one type (the material of channel 450) that is different from nitride 460 or other capping or insulator layer. The processing uses techniques of chemical combinations and controlled temperature environments to create a metallic material to form cap 452 while not creating any metallic material on nitride 460. The nitride has different physical properties from channel 450, which allows the selective metallic growth of cap 452. While cap 452 is illustrates as having approximately the same thickness as nitride 460, it will be understood that cap 452 can be the same thickness or be thinner or thicker than nitride 460. The thickness of cap 452 depends on the processing used to selectively create cap 452 based on the implementation intended for the circuit. Significantly, the creation of cap 452 does not deposit material outside of the area intended for cap 452 (i.e., at the end of channel 450), and there may be no need for polishing or other processing to remove excess material. The lack of polishing can prevent the introduction of processing artifacts while creating cap 452. Specifically, polishing artifacts can be eliminated.

Figure 4D:
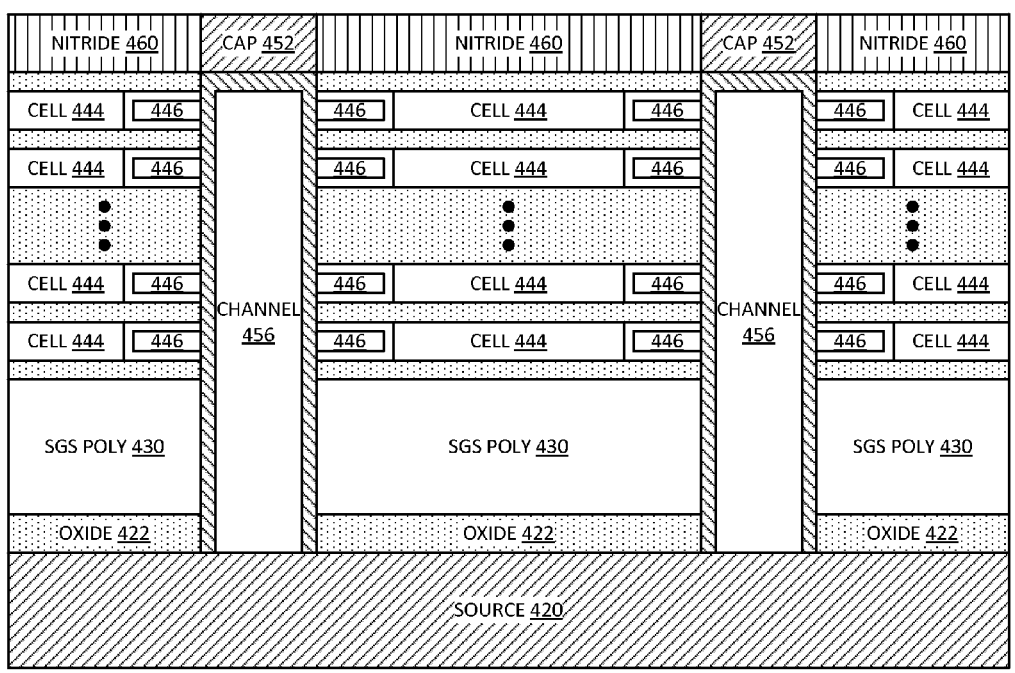

FIG. 4D illustrates circuit state 408, which can be an alternative to circuit state 406 of FIG. 4C. More specifically, circuit state 408 illustrates a state in which the processing creates a channel cap or conductive cap with a recessing operation, but illustrates an implementation with a hollow channel. As with circuit state 406, the processing first creates a recess via etch or another process, and then fills the recess with the material for cap 452. Cap 452 is selectively grown by a process of selective deposition or other selective operation that can grow or deposit material in one area of the circuit but not another. Channel 456 represents a hollow channel conductor. With a hollow channel, the processing deposits a material such as poly on the side walls of the pillar, and fills the pillar with an oxide or other insulator. The processing then caps the pillar with a poly material. Cap 452 is an additional cap on channel 456, and is selectively grown in accordance with what is described with reference to circuit state 406.

Figure 4E:
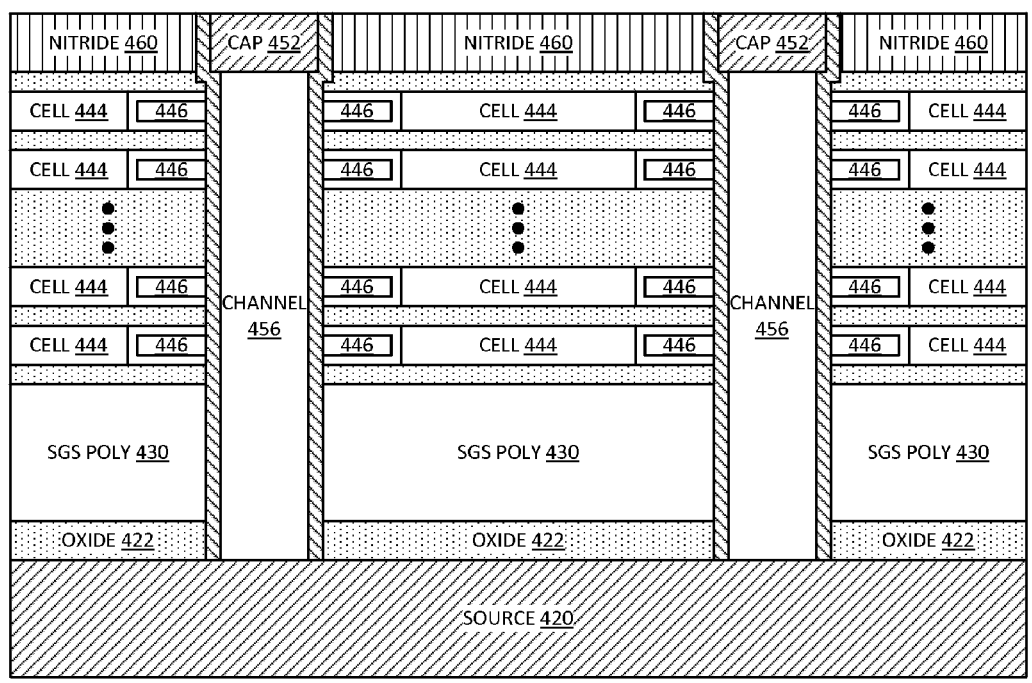

FIG. 4E illustrates circuit state 410, which can be an alternative to circuit state 408 of FIG. 4D and circuit state 406 of FIG. 4C. More specifically, circuit state 410 illustrates a state in which the processing creates hollow channel growth on the sidewalls prior to selective growth of cap 452. For circuit state 410, the processing creates a channel cap or conductive cap with a recessing operation and hollow channel 456. As with circuit states 406 and 408, the processing first creates a recess via etch or another process, and then fills the recess with the material for cap 452. However, prior to selectively growing cap 452, the processing can selectively grow an extension of the hollow channel sidewall material in the recess. Channel 456 represents a hollow channel conductor, with cap 452 selectively grown in accordance with what is described with reference to circuit state 406.

Figure 4F:
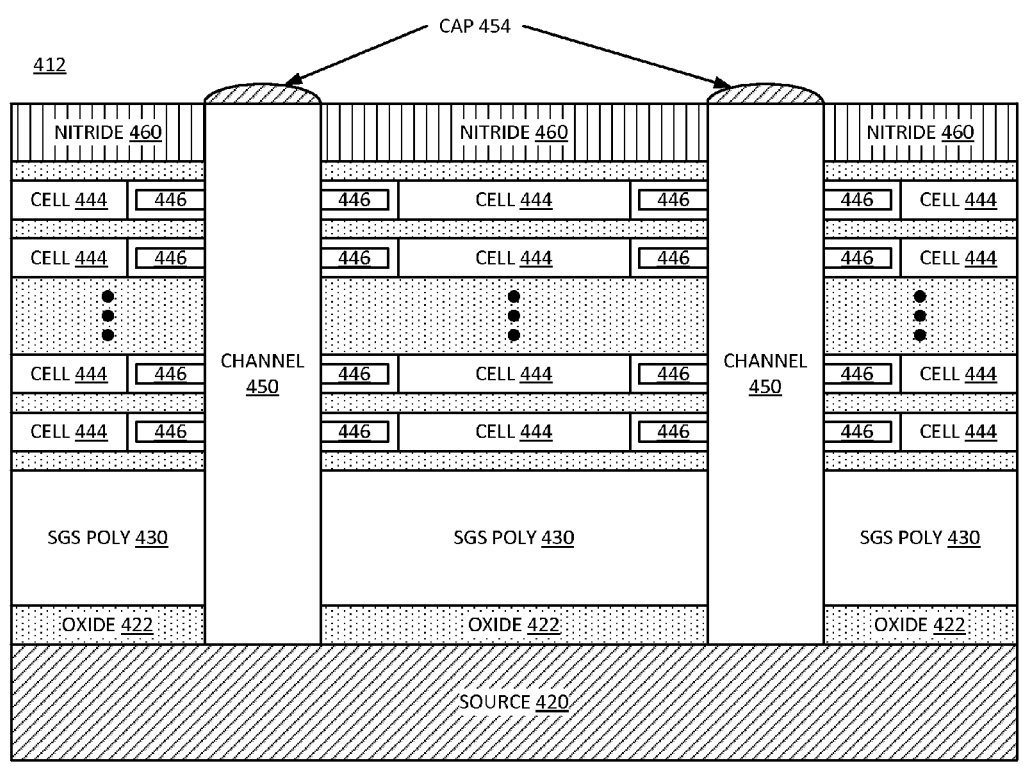

FIG. 4F illustrates circuit state 412, in which the processing creates a channel cap or conductive cap without recessing the channel. It will be understood that circuit state 408 is an alternative to circuit state 406. While the processing could be configured to use different types of channel caps for different channels in the same stack of tiers, typically all channel caps on a stack will be of the same type (either recessed or non-recessed). In one embodiment, the processing creates cap 454 at the end of channel 450 without recessing. Channel 450 is a solid channel. Similar to what is discussed for cap 452 above, the creation of cap 454 can be selective and controlled to create the cap at the end of channel 450, but not deposit material outside of the area intended for cap 454 (i.e., at the end of channel 450). Thus, there may be no need for polishing or other processing to remove excess material after creation of cap 454. The lack of polishing can prevent the introduction of processing artifacts while creating cap 454. Specifically, polishing artifacts can be eliminated.

Figure 4G:
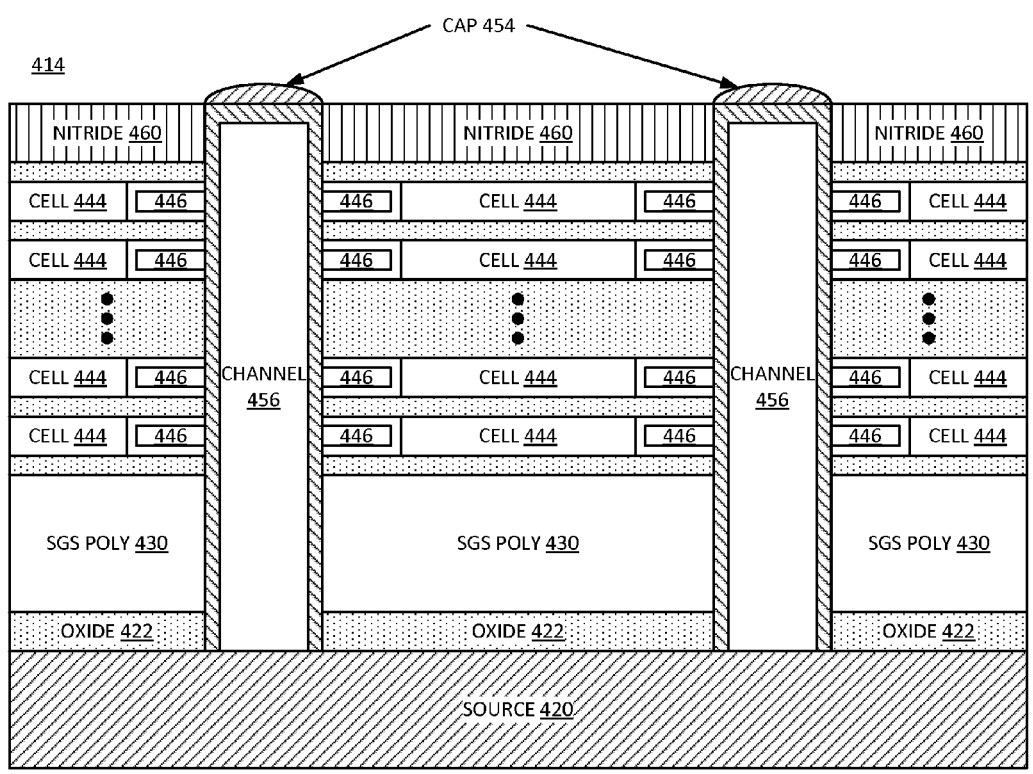

FIG. 4G illustrates circuit state 414, which can be an alternative to circuit state 412 of FIG. 4F. More specifically, circuit state 414 illustrates a state in which the processing creates a channel cap or conductive cap without a recessing operation, but illustrates an implementation with a hollow channel. The processing creates channel 456 as a hollow channel. With a hollow channel, the processing deposits a material such as poly on the side walls of the pillar, and fills the pillar with an oxide or other insulator. The processing then caps the pillar with a poly material. Cap 454 is an additional cap on channel 456, and is selectively grown in accordance with what is described with reference to circuit state 412.

Figure 5A:
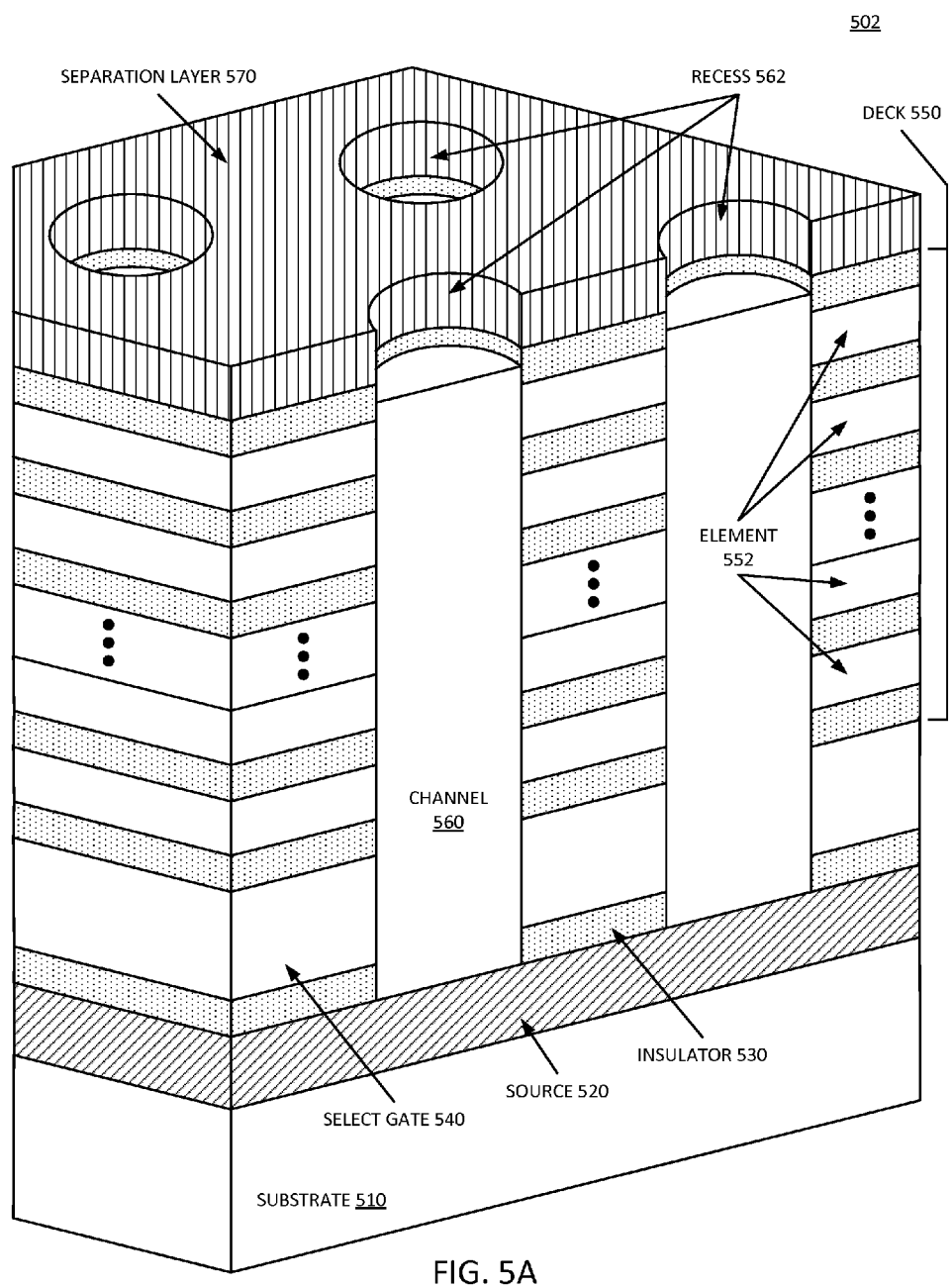
FIG. 5A is a perspective view block diagram of an embodiment of a stacked circuit with a recess on the channel for a channel cap.

FIG. 5A is a perspective view block diagram of an embodiment of a stacked circuit with a recess on the channel for a channel cap. Circuit 502 can be one example of a stacked circuit with a recessed channel cap in accordance with any embodiment described. For example, circuit 502 can be one example of circuits 102, 200, 300, or the circuit illustrated in FIGS. 4A-4D. Circuit 502 illustrates a cross-sectional perspective view of an embodiment of a stacked circuit.

Substrate 510 represents a semiconductor substrate (such as a silicon substrate) on which circuit 502 is processed. Source 520 represents a conductive layer that provides charge carriers to channel 560. Insulator 530 represents a layer that separates source 520 from select gate 540. Select gate 540 represents a layer of conductive material that can provide control in activating circuit elements 552 of deck 550. Deck 550 represents a number of tiers of circuit elements 552, which can be formed as alternating layer of circuit elements separated by oxide or other insulator layers. Channel 560 extends from one end of deck 550 to form an ohmic contact with source 520.

Separation layer 570 represents a nitride layer or other layer that separates deck 550 from other circuit components processed on the multiple tiers. Recesses 562 represent recesses formed in separation layer to expose channels 560. In one embodiment, the structures are cylindrical as illustrated. It will be understood that while round geometries are common, other geometries might be used. In one embodiment, recesses 562 extend through separation layer 570 and into an oxide layer or otherwise into deck 550 to expose channel 560. The depth of recesses 562 can be controlled, and for example can be shallower than what is shown.

Figure 5B:
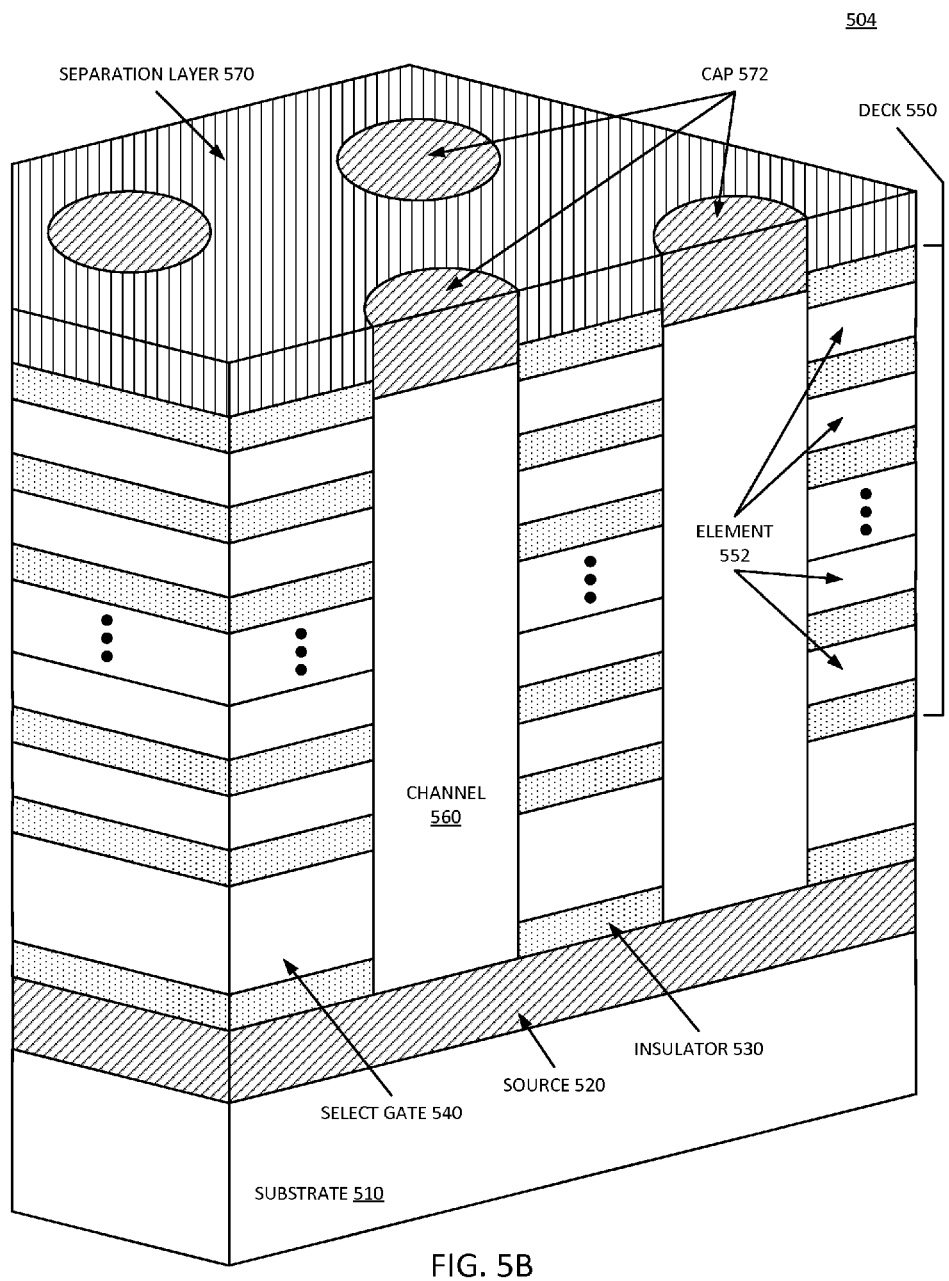
FIG. 5B is a perspective view block diagram of an embodiment of a stacked circuit with a channel cap selectively grown in the recess.

FIG. 5B is a perspective view block diagram of an embodiment of a stacked circuit with a channel cap selectively grown in the recess. Circuit 504 represents circuit 502 after the processing of channel caps 572. Caps 572 are formed by selective metallic layer formation. In one embodiment, the processing forms caps 572 after a poly pillar recess process used to create channel 560 and recesses 562. Selective metallic layer formation can simplify the semiconductor processing flow while reducing costs. In one embodiment, channels 560 are considered to be sparsely distributed within the circuit, which can reduce the risk of metal short from one channel to another. In a higher density distribution of channels 560, the processing might need to be more carefully controlled for formation of caps 572 to prevent shorting.

In one embodiment, caps 572 are made of metal. In one embodiment, caps 572 are made of metal oxide. In one embodiment, caps 572 are made of metal silicide. In one embodiment, more than one element is selectively grown in the recesses. Thus, in one embodiment, caps 572 can be multiple layers of material. For example, caps 572 can be oxide caps over poly pillars, which allows caps 572 to act as a stopping layer for etching a pillar or etching a channel in a subsequent deck of elements (not shown). In such an implementation caps 572 can be selectively removed after the pillar etch. Whatever material is used for caps 572, the caps can be selectively grown to fill the recesses without having to polish the circuit.

Figure 6A:
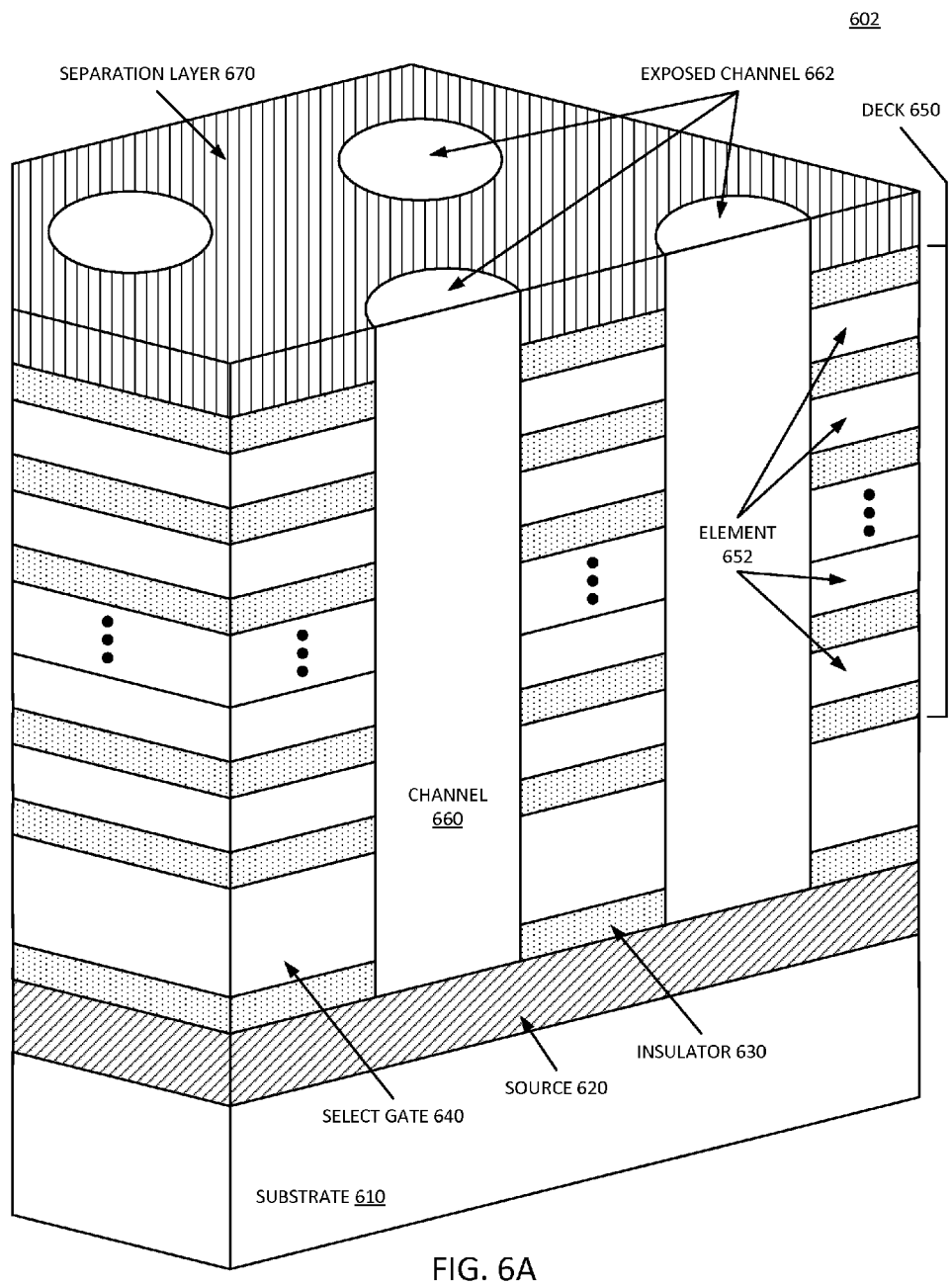
FIG. 6A is a perspective view block diagram of an embodiment of a stacked circuit with a non-recessed channel for a channel cap.

FIG. 6A is a perspective view block diagram of an embodiment of a stacked circuit with a non-recessed channel for a channel cap. Circuit 602 can be one example of a stacked circuit with a non-recessed channel cap in accordance with any embodiment described. For example, circuit 602 can be one example of circuits 104, 200, 300, or the circuit illustrated in FIGS. 4A-4D. Circuit 602 illustrates a cross-sectional perspective view of an embodiment of a stacked circuit.

Substrate 610 represents a semiconductor substrate (such as a silicon substrate) on which circuit 602 is processed. Source 620 represents a conductive layer that provides charge carriers to channel 660. Insulator 630 represents a layer that separates source 620 from select gate 640. Select gate 640 represents a layer of conductive material that can provide control in activating circuit elements 652 of deck 650. Deck 650 represents a number of tiers of circuit elements 652, which can be formed as alternating layer of circuit elements separated by oxide or other insulator layers. Channel 660 extends from one end of deck 650 to form an ohmic contact with source 620.

Separation layer 670 represents a nitride layer or other layer that separates deck 650 from other circuit components processed on the multiple tiers. In one embodiment, the processing forms channels 660 by exposing areas in separation layer 670, etching a pillar, and then filling the pillar with a conductor. Thus, channel 660 can be created to extend from source 620 through deck 650 and through separation layer 670. Thus, in one embodiment, circuit 502 includes exposed channel ends 662. In one embodiment, the structures are cylindrical as illustrated. It will be understood that while round geometries are common, other geometries might be used. Exposed channel ends 662 are of a different material from separation layer 670, which can allow for selective growth of a channel cap conductor.

Figure 6B:
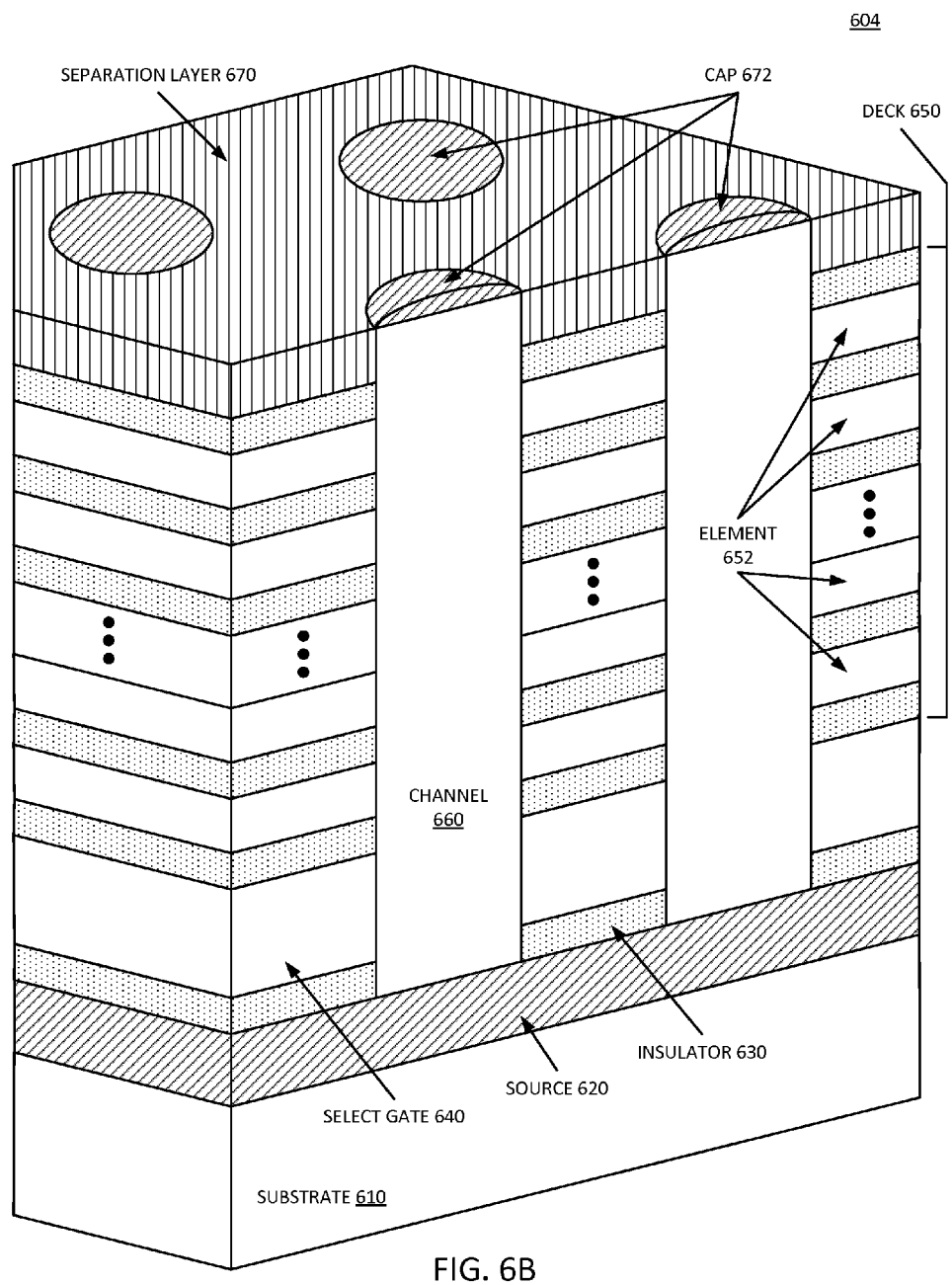
FIG. 6B is a perspective view block diagram of an embodiment of a stacked circuit with a channel cap selectively grown on the channel conductor without a recess.

FIG. 6B is a perspective view block diagram of an embodiment of a stacked circuit with a channel cap selectively grown on the channel conductor without a recess. Circuit 604 represents circuit 602 after the processing of channel caps 672. Caps 672 are formed by selective metallic layer formation on exposed channel ends 662. In one embodiment, the processing forms caps 672 after a poly pillar CMP process used to expose the ends of channel 660. Selective metallic layer formation can simplify the semiconductor processing flow while reducing costs. In one embodiment, channels 660 are considered to be sparsely distributed within the circuit, which can reduce the risk of metal short from one channel to another. In a higher density distribution of channels 660, the processing might need to be more carefully controlled for formation of caps 672 to prevent shorting.

In one embodiment, caps 672 are made of metal. In one embodiment, caps 672 are made of metal oxide. In one embodiment, caps 672 are made of metal silicide. In one embodiment, more than one element is selectively grown in the recesses. Thus, in one embodiment, caps 672 can be multiple layers of material. For example, caps 672 can be oxide caps over poly pillars, which allows caps 672 to act as a stopping layer for etching a pillar or etching a channel in a subsequent deck of elements (not shown). It will be understood that depending on the material and the process used for another deck of elements that a non-recessed cap 672 may not be sufficiently thick as an etch stop layer. In an implementation where cap 672 can function as an etch stop layer, caps 672 can be selectively removed after the pillar etch. Whatever material is used for caps 672, the caps can be selectively grown to fill the recesses without having to polish the circuit.

Figure 7:
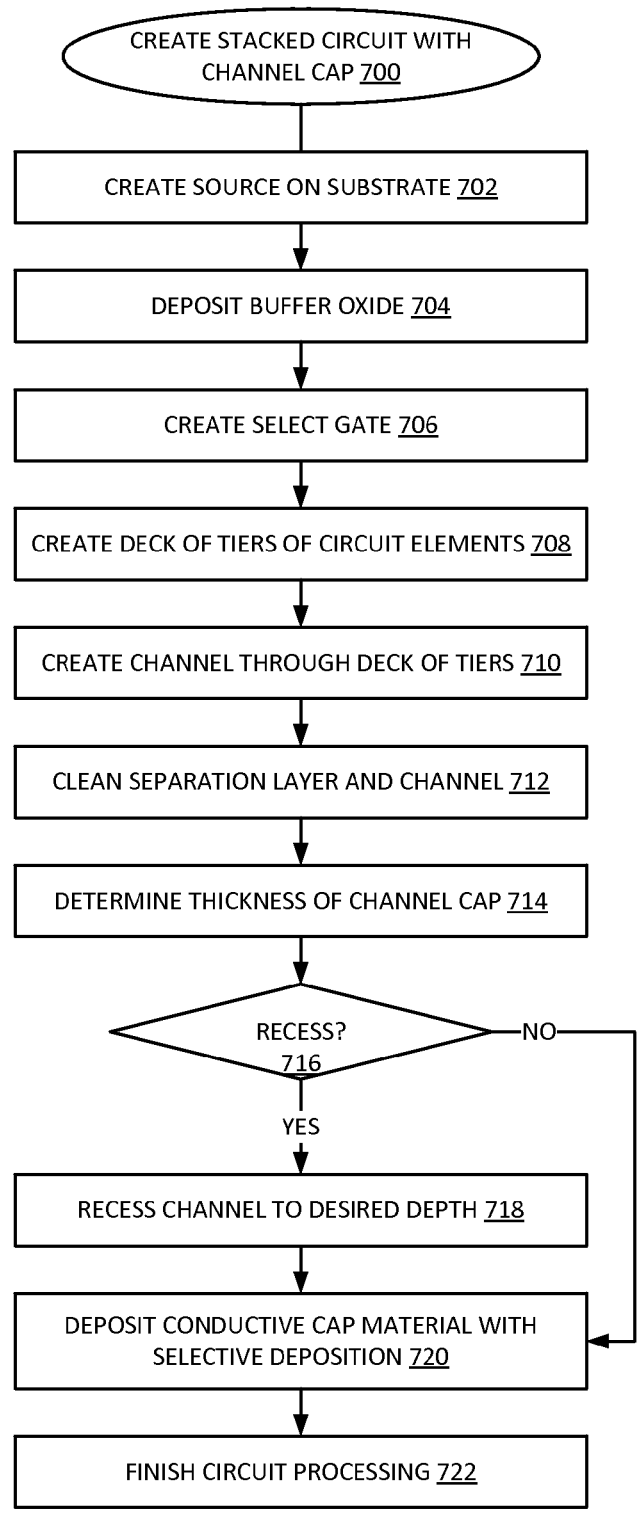
FIG. 7 is a flow diagram of an embodiment of a process for creating a stacked circuit with a selectively created channel cap.

FIG. 7 is a flow diagram of an embodiment of a process for creating a stacked circuit with a selectively created channel cap. The selectively created channel cap can avoid the need for certain processing operations that were previously required to isolate contact to the ends of the channels of a stacked circuit. Process 700 can be one example of a process to produce the circuit and circuit states of FIGS. 4A-4B. Process 700 can be executed by processing equipment of a manufacturing entity. The manufacturer configures the processing equipment and performs a series of processing steps or operations on a semiconductor wafer to create the electronic circuits. The processing equipment can include tools to perform any type of materials processing operations (deposit, CMP, etch, ion implant, annealing, other). Such processing equipment includes computer equipment and mechanical and electrical tools that perform the processing. The processing equipment is controlled by one or more processing operation controls, which can include hardware logic and/or software/firmware logic to control the processing. The equipment can be programmed or configured to perform certain operations in a certain order. Collectively the equipment and processing or configuration can be referred to as a processing system. For purposes of process 700, the operations are described as being performed by "the processing," which refers indirectly to the manufacturer and the processing system used by the manufacturer.

The processing creates a source region on a semiconductor substrate, such as a silicon wafer, 702. The electronic circuit will be manufactured on the source. The source is a conductor that can be activated to create electrical activity in the circuit elements. In one embodiment, the processing deposits a buffer oxide or other insulator on the source, 704. The processing creates a select gate for the tiers of circuit elements that are processed on the source, 706. In one embodiment, the select gate is the gate for all stacked circuit elements in the deck.

The processing creates a deck of tiers of circuit elements, 708. In one embodiment, the processing deposits layers or tiers of cells or other circuit elements separated by oxide or another inter-tier insulator. The tiers of circuit elements are stacked adjacent each other, and can be processed in multiple cycles of operations where material can be selectively deposited and removed to create the desired circuit elements, such as memory cells. The processing can also deposit an insulator, such as a nitride material, on the deck as a hard mask insulator. In one embodiment, the processing performs a punch etch to create a pillar for a channel, the pillar exposing the source conductor layer on which the deck of circuit elements is processed, 710.

In one embodiment, the processing cleans the separation layer and the channel, 712. For example, the processing can perform operations (including polishing) on the separation layer and ends of the channel to have a clean surface to allow selective growing of the channel cap. In one embodiment, the circuit will result in having processing artifacts including polishing artifacts from operations that occur prior to selective creation of the channel caps. Even in such an implementation, the circuit will not have processing artifacts from the creation of the channel caps, because they are selectively grown or deposited and do not require a cleaning process.

In one embodiment, the processing can be configured to create a recess in which to selectively create the channel cap. In one embodiment, the processing can be configured to selectively create a channel cap without creating a recess first, but simply creating the channel cap on the end of the channel. While such processes will generally be separate, they are shown together in process 700 for simplicity in explanation. In one embodiment, the processing determines a thickness of a channel cap to use, 714. It will be understood that the processing can be configured to make the channel cap of a specified thickness, and thus, the determining can be to follow a process flow that creates the specified channel cap.

Depending on the desired thickness of channel cap, the processing can create a recess. If the processing is to create a recess in the channel, 716 YES branch, the processing recesses the channel to the desired or configured depth, 718. If the processing is not to create a recess, 716 NO branch, the processing does not create a recess. In one embodiment, in either the case of a recess or not a recess, the processing deposits a conductive capping material layer on the end of the channel with selective deposition, 720. The desired thickness of the channel cap can be related to additional processing to be performed on the circuit (e.g., a selectivity of an etch for an adjacent deck, which can require a thicker or thinner stop layer). After creating the channel caps, the processing can finish the circuit processing, 722. The finish of the circuit processing can include creating additional deck(s) of circuit elements, processing signal lines, or other processing.

Figure 8:
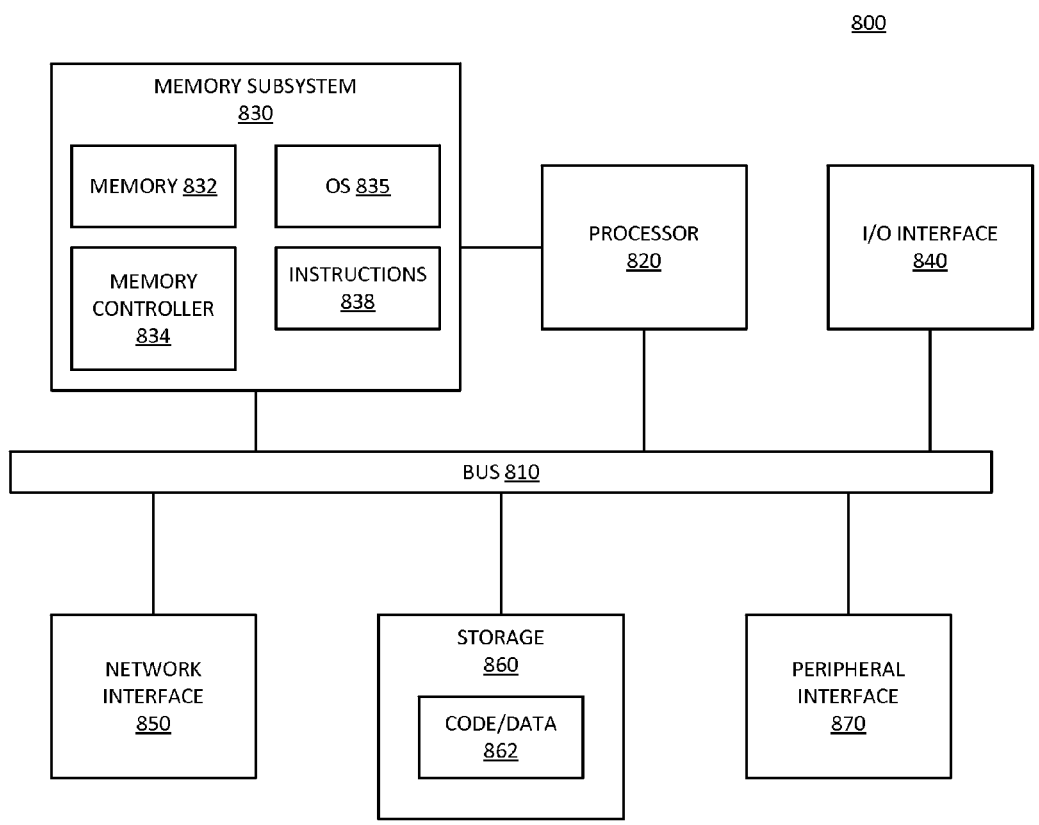
FIG. 8 is a block diagram of an embodiment of a computing system in which a stacked circuit with a selectively created channel cap can be implemented.

FIG. 8 is a block diagram of an embodiment of a computing system in which a stacked circuit with a selectively created channel cap can be implemented. System 800 represents a computing device in accordance with any embodiment described herein, and can be a laptop computer, a desktop computer, a server, a gaming or entertainment control system, a scanner, copier, printer, routing or switching device, or other electronic device. System 800 includes processor 820, which provides processing, operation management, and execution of instructions for system 800. Processor 820 can include any type of microprocessor, central processing unit (CPU), processing core, or other processing hardware to provide processing for system 800. Processor 820 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 830 represents the main memory of system 800, and provides temporary storage for code to be executed by processor 820, or data values to be used in executing a routine. Memory subsystem 830 can include one or more memory devices such as read-only memory (ROM), flash memory, one or more varieties of random access memory (RAM), or other memory devices, or a combination of such devices. Memory subsystem 830 stores and hosts, among other things, operating system (OS) 836 to provide a software platform for execution of instructions in system 800. Additionally, other instructions 838 are stored and executed from memory subsystem 830 to provide the logic and the processing of system 800. OS 836 and instructions 838 are executed by processor 820. Memory subsystem 830 includes memory device 832 where it stores data, instructions, programs, or other items. In one embodiment, memory subsystem includes memory controller 834, which is a memory controller to generate and issue commands to memory device 832. It will be understood that memory controller 834 could be a physical part of processor 820.

Processor 820 and memory subsystem 830 are coupled to bus/bus system 810. Bus 810 is an abstraction that represents any one or more separate physical buses, communication lines/interfaces, and/or point-to-point connections, connected by appropriate bridges, adapters, and/or controllers. Therefore, bus 810 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 810 can also correspond to interfaces in network interface 850.

System 800 also includes one or more input/output (I/O) interface(s) 840, network interface 850, one or more internal mass storage device(s) 860, and peripheral interface 870 coupled to bus 810. I/O interface 840 can include one or more interface components through which a user interacts with system 800 (e.g., video, audio, and/or alphanumeric interfacing). In one embodiment, I/O interface 840 can include a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. High definition can also refer to projected displays (e.g., head-mounted displays) that have comparable visual quality to pixel displays. Network interface 850 provides system 800 the ability to communicate with remote devices (e.g., servers, other computing devices) over one or more networks. Network interface 850 can include an Ethernet adapter, wireless interconnection components, USB (universal serial bus), or other wired or wireless standards-based or proprietary interfaces.

Storage 860 can be or include any conventional medium for storing large amounts of data in a nonvolatile manner, such as one or more magnetic, solid state, or optical based disks, or a combination. Storage 860 holds code or instructions and data 862 in a persistent state (i.e., the value is retained despite interruption of power to system 800). Storage 860 can be generically considered to be a "memory," although memory 830 is the executing or operating memory to provide instructions to processor 820. Whereas storage 860 is nonvolatile, memory 830 can include volatile memory (i.e., the value or state of the data is indeterminate if power is interrupted to system 800).

Peripheral interface 870 can include any hardware interface not specifically mentioned above. Peripherals refer generally to devices that connect dependently to system 800. A dependent connection is one where system 800 provides the software and/or hardware platform on which operation executes, and with which a user interacts.

In one embodiment, memory device 832 of memory subsystem 830 and/or other components of system 800 include circuits that are created as stacked circuits with selectively created channel caps. With selective creation of the channel caps, the circuit excludes processing artifacts related to removing excess channel cap material from a separation layer of the circuit. Rather, the channel caps are selectively grown on the ends of the channels reducing the creation of excess channel cap material, and thus no polishing is required to remove excess channel cap material.

Figure 9:
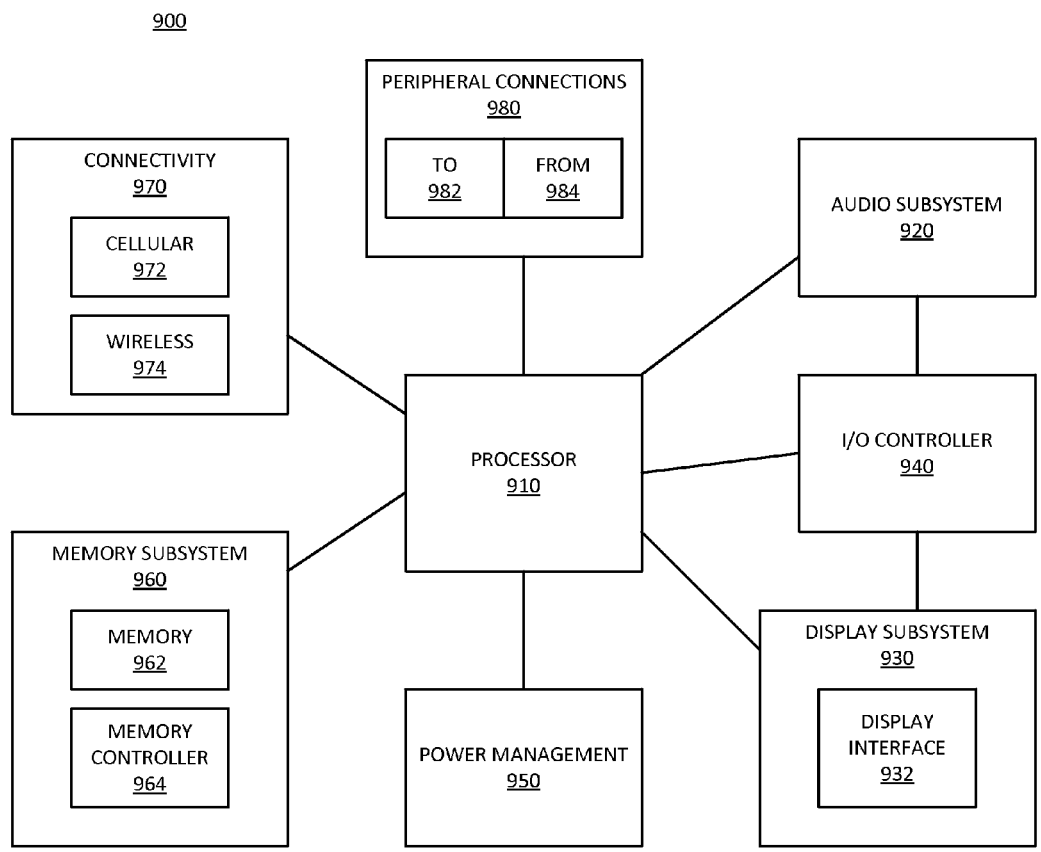
FIG. 9 is a block diagram of an embodiment of a mobile device in which a stacked circuit with a selectively created channel cap can be implemented.

FIG. 9 is a block diagram of an embodiment of a mobile device in which a stacked circuit with a selectively created channel cap can be implemented. Device 900 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 900.

Device 900 includes processor 910, which performs the primary processing operations of device 900. Processor 910 can include one or more physical devices, such as microprocessors, application processors, microcontrollers, programmable logic devices, or other processing means. The processing operations performed by processor 910 include the execution of an operating platform or operating system on which applications and/or device functions are executed. The processing operations include operations related to I/O (input/output) with a human user or with other devices, operations related to power management, and/or operations related to connecting device 900 to another device. The processing operations can also include operations related to audio I/O and/or display I/O.

In one embodiment, device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 900, or connected to device 900. In one embodiment, a user interacts with device 900 by providing audio commands that are received and processed by processor 910.

Display subsystem 930 represents hardware (e.g., display devices) and software (e.g., drivers) components that provide a visual and/or tactile display for a user to interact with the computing device. Display subsystem 930 includes display interface 932, which includes the particular screen or hardware device used to provide a display to a user. In one embodiment, display interface 932 includes logic separate from processor 910 to perform at least some processing related to the display. In one embodiment, display subsystem 930 includes a touchscreen device that provides both output and input to a user. In one embodiment, display subsystem 930 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. High definition can also refer to projected displays (e.g., head-mounted displays) that have comparable visual quality to pixel displays.

I/O controller 940 represents hardware devices and software components related to interaction with a user. I/O controller 940 can operate to manage hardware that is part of audio subsystem 920 and/or display subsystem 930. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of device 900. Additionally, audio output can be provided instead of or in addition to display output. In another example, if display subsystem includes a touchscreen, the display device also acts as an input device, which can be at least partially managed by I/O controller 940. There can also be additional buttons or switches on device 900 to provide I/O functions managed by I/O controller 940.

In one embodiment, I/O controller 940 manages devices such as accelerometers, cameras, light sensors or other environmental sensors, gyroscopes, global positioning system (GPS), or other hardware that can be included in device 900. The input can be part of direct user interaction, as well as providing environmental input to the system to influence its operations (such as filtering for noise, adjusting displays for brightness detection, applying a flash for a camera, or other features). In one embodiment, device 900 includes power management 950 that manages battery power usage, charging of the battery, and features related to power saving operation.

Memory subsystem 960 includes memory device(s) 962 for storing information in device 900. Memory subsystem 960 can include nonvolatile (state does not change if power to the memory device is interrupted) and/or volatile (state is indeterminate if power to the memory device is interrupted) memory devices. Memory 960 can store application data, user data, music, photos, documents, or other data, as well as system data (whether long-term or temporary) related to the execution of the applications and functions of system 900. In one embodiment, memory subsystem 960 includes memory controller 964 (which could also be considered part of the control of system 900, and could potentially be considered part of processor 910). Memory controller 964 includes a scheduler to generate and issue commands to memory device 962.

Connectivity 970 includes hardware devices (e.g., wireless and/or wired connectors and communication hardware) and software components (e.g., drivers, protocol stacks) to enable device 900 to communicate with external devices. The external device could be separate devices, such as other computing devices, wireless access points or base stations, as well as peripherals such as headsets, printers, or other devices.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading and/or uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory device 962 of memory subsystem 960 and/or other components of system 900 include circuits that are created as stacked circuits with selectively created channel caps. With selective creation of the channel caps, the circuit excludes processing artifacts related to removing excess channel cap material from a separation layer of the circuit. Rather, the channel caps are selectively grown on the ends of the channels reducing the creation of excess channel cap material, and thus no polishing is required to remove excess channel cap material.

In one aspect, a circuit device with a three dimensional circuit, comprising: a source conductor layer on a semiconductor substrate; multiple tiers of circuit elements stacked adjacent each other, each tier including a circuit element activated via a gate; at least one conductor channel extending through the multiple tiers of circuit elements, the conductor channel to electrically couple the gates of the circuit elements to the source conductor; and a conductive cap on each conductor channel, the conductive cap layer forming an ohmic contact with the conductor channel, each conductive cap formed on each conductor channel in openings in a separation layer, the conductive cap not having polishing artifacts.

In one embodiment, the conductive cap comprises a layer of selectively deposited metallic material. In one embodiment, the conductive cap comprises a layer of metal oxide. In one embodiment, the conductive cap comprises a layer of metal silicide. In one embodiment, the separation layer comprises a layer of non-metal nitride. In one embodiment, the conductive cap comprises a layer selectively deposited into a recess on the conductor channel. In one embodiment, the conductor channel extends through the separation layer, and wherein the conductive cap is a rounded cap selectively deposited on the conductor channel. In one embodiment, the separation layer further does not have polishing artifacts. In one embodiment, further comprising: a bitline to ohmically contact the conductor channel via the conductive cap. In one embodiment, the multiple tiers of circuit elements, the conductor channel, and the conductive cap are, respectively, first multiple tiers of circuit elements, first conductor channel, and first conductive cap of a first deck, and further comprising: a second deck, including second multiple tiers of circuit elements, a second conductor channel, and a second conductive cap; and wherein the first conductive cap is a stop layer between the first deck and the second deck, to interconnect the second conductor channel of the second deck to the first conductor channel of the first deck.

In one aspect, an electronic device with a memory device includes: a three-dimensional stacked memory device to store data, the memory device including: a source conductor layer on a semiconductor substrate; multiple tiers of memory cells stacked adjacent each other, each tier including a memory cell activated via a gate; at least one conductor channel extending through the multiple tiers of memory cells, the conductor channel to electrically couple the gates of the memory cells to the source conductor; and a conductive cap on each conductor channel, the conductive cap layer forming an ohmic contact with the conductor channel, each conductive cap formed on each conductor channel in openings in a separation layer, the conductive cap and separation layer not having polishing artifacts; and a touchscreen display coupled to generate a display based on data accessed from the memory device.

In one embodiment, the conductive cap comprises selectively deposited metallic material. In one embodiment, the conductive cap comprises selectively deposited metal oxide. In one embodiment, the conductive cap comprises selectively deposited metal silicide. In one embodiment, the separation layer comprises a layer of non-metal nitride. In one embodiment, the conductive cap comprises a layer selectively deposited into a recess on the conductor channel. In one embodiment, the conductor channel extends through the separation layer, and wherein the conductive cap is a rounded cap selectively deposited on the conductor channel. In one embodiment, the conductor channel extends through the separation layer, and wherein the conductive cap is cap selectively deposited on a non-recessed conductor channel. In one embodiment, the separation layer further does not have polishing artifacts. In one embodiment, the multiple tiers of memory cells, the conductor channel, and the conductive cap are, respectively, first multiple tiers of memory cells, first conductor channel, and first conductive cap of a first deck, and further comprising: a second deck, including second multiple tiers of memory cells, a second conductor channel, and a second conductive cap; and wherein the first conductive cap is a stop layer between the first deck and the second deck, to interconnect the second conductor channel of the second deck to the first conductor channel of the first deck. In one embodiment, further comprising: a bitline to ohmically contact the conductor channel via the conductive cap.

In one aspect, a method for creating a three dimensional circuit includes: creating a source conductor layer on a semiconductor substrate; creating a deck of multiple tiers of circuit elements stacked adjacent each other, each tier including a circuit element activated via a gate; creating at least one conductor channel extending through the deck, the conductor channel to electrically couple the gates of the circuit elements to the source conductor; and depositing a conductive cap on each conductor channel, the conductive cap layer forming an ohmic contact with the conductor channel, each conductive cap formed on each conductor channel in openings in a separation layer, without generating polishing artifacts in the conductive cap and separation layer.

In one embodiment, creating the conductive cap comprises selectively depositing metal. In one embodiment, creating the conductive cap comprises selectively depositing metal oxide. In one embodiment, creating the conductive cap comprises selectively depositing metal silicide. In one embodiment, depositing the conductive cap comprises selectively depositing conductive material into an etched recess on the conductor channel. In one embodiment, the conductor channel extends through the separation layer, and wherein depositing the conductive cap comprises selectively depositing a mushroom cap on the conductor channel. In one embodiment, further comprising: creating a bitline to ohmically contact the conductor channel via the conductive cap. In one embodiment, the multiple tiers of circuit elements, the conductor channel, and the conductive cap are, respectively, first multiple tiers of circuit elements, first conductor channel, and first conductive cap of a first deck, and further comprising: creating a second deck, including creating second multiple tiers of circuit elements, creating a second conductor channel, and depositing a second conductive cap; and wherein the first conductive cap is a stop layer between the first deck and the second deck, to interconnect the second conductor channel of the second deck to the first conductor channel of the first deck. In one embodiment, further comprising: creating a bitline to ohmically contact the conductor channel via the conductive cap.

In one aspect, an article of manufacture comprising a computer readable storage medium having content stored thereon, which when executed performs operations for creating a three dimensional circuit, including: creating a source conductor layer on a semiconductor substrate; creating a deck of multiple tiers of circuit elements stacked adjacent each other, each tier including a circuit element activated via a gate; creating at least one conductor channel extending through the deck, the conductor channel to electrically couple the gates of the circuit elements to the source conductor; and depositing a conductive cap on each conductor channel, the conductive cap layer forming an ohmic contact with the conductor channel, each conductive cap formed on each conductor channel in openings in a separation layer, without generating polishing artifacts in the conductive cap and separation layer.

In one embodiment, the content for creating the conductive cap comprises content for selectively depositing metal. In one embodiment, the content for creating the conductive cap comprises content for selectively depositing metal oxide. In one embodiment, the content for creating the conductive cap comprises content for selectively depositing metal silicide. In one embodiment, the content for depositing the conductive cap comprises content for selectively depositing conductive material into an etched recess on the conductor channel. In one embodiment, the conductor channel extends through the separation layer, and wherein the content for depositing the conductive cap comprises content for selectively depositing a mushroom cap on the conductor channel. In one embodiment, further comprising content for creating a bitline to ohmically contact the conductor channel via the conductive cap. In one embodiment, the multiple tiers of circuit elements, the conductor channel, and the conductive cap are, respectively, first multiple tiers of circuit elements, first conductor channel, and first conductive cap of a first deck, and further comprising content for creating a second deck, including creating second multiple tiers of circuit elements, creating a second conductor channel, and depositing a second conductive cap; and wherein the first conductive cap is a stop layer between the first deck and the second deck, to interconnect the second conductor channel of the second deck to the first conductor channel of the first deck. In one embodiment, further comprising content for creating a bitline to ohmically contact the conductor channel via the conductive cap.

In one aspect, an apparatus for creating a three dimensional circuit includes: means for creating a source conductor layer on a semiconductor substrate; means for creating a deck of multiple tiers of circuit elements stacked adjacent each other, each tier including a circuit element activated via a gate; means for creating at least one conductor channel extending through the deck, the conductor channel to electrically couple the gates of the circuit elements to the source conductor; and means for depositing a conductive cap on each conductor channel, the conductive cap layer forming an ohmic contact with the conductor channel, each conductive cap formed on each conductor channel in openings in a separation layer, without generating polishing artifacts in the conductive cap and separation layer.

In one embodiment, the means for creating the conductive cap comprises means for selectively depositing metal. In one embodiment, the means for creating the conductive cap comprises means for selectively depositing metal oxide. In one embodiment, the means for creating the conductive cap comprises means for selectively depositing metal silicide. In one embodiment, the means for depositing the conductive cap comprises means for selectively depositing conductive material into an etched recess on the conductor channel. In one embodiment, the conductor channel extends through the separation layer, and wherein the means for depositing the conductive cap comprises means for selectively depositing a mushroom cap on the conductor channel. In one embodiment, further comprising: means for creating a bitline to ohmically contact the conductor channel via the conductive cap. In one embodiment, the multiple tiers of circuit elements, the conductor channel, and the conductive cap are, respectively, first multiple tiers of circuit elements, first conductor channel, and first conductive cap of a first deck, and further comprising means for creating a second deck, including creating second multiple tiers of circuit elements, creating a second conductor channel, and depositing a second conductive cap; and wherein the first conductive cap is a stop layer between the first deck and the second deck, to interconnect the second conductor channel of the second deck to the first conductor channel of the first deck. In one embodiment, further comprising: means for creating a bitline to ohmically contact the conductor channel via the conductive cap.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A circuit device comprising:
a source conductor layer on a semiconductor substrate;
a first deck including multiple tiers of circuit elements stacked adjacent each other, each tier including a circuit element to be activated via a gate;
at least one first conductor channel extending through the multiple tiers of circuit elements, the first conductor channel to electrically couple the gates of the circuit elements to the source conductor;
a first conductive cap on each first conductor channel, the first conductive caps forming an ohmic contact with respective first conductor channels, each first conductive cap formed on each first conductor channel in openings in a separation layer, the first conductive caps not having polishing artifacts:
a bitline to ohmically contact the first conductor channel via the first conductive cap; and
a second deck, including second multiple tiers of circuit elements, second conductor channels, and second conductive caps;
wherein the first conductive cap is a stop layer between the first deck and the second deck, to interconnect the second conductor channel of the second deck to the first conductor channel of the first deck.

2. The circuit device of claim 1, wherein the first and second conductive caps comprises a layer of selectively deposited metallic material.

3. The circuit device of claim 2, wherein the first and second conductive caps comprises a layer of metal oxide.

4. The circuit device of claim 2, wherein the first and second conductive caps comprises a layer of metal silicide.

5. The circuit device of claim 1, wherein the separation layer comprises a layer of non-metal nitride.

6. The circuit device of claim 1, wherein the first and second conductive caps comprises a layer selectively deposited into a recess on the first and second conductor channels.

7. The circuit device of claim 1, wherein the first conductor channels extend through the separation layer, and wherein the first conductive caps includes rounded caps selectively deposited on the first conductor channels.

8. The circuit device of claim 1, wherein the separation layer further does not have polishing artifacts.

9. An electronic device comprising:
a three-dimensional stacked memory device to store data, the memory device including:
a source conductor layer on a semiconductor substrate;
a first deck including multiple tiers of memory cells stacked adjacent each other, each tier including a memory cell to be activated via a gate;
at least one first conductor channel extending through the multiple tiers of memory cells, the first conductor channel to electrically couple the gates of the memory cells to the source conductor;
a first conductive cap on each first conductor channel, the first conductive caps forming an ohmic contact with respective first conductor channels, each first conductive cap formed on each first conductor channel in openings in a separation layer, the first conductive caps not having polishing artifacts; and
a second deck, including second multiple tiers of circuit elements, second conductor channels, and second conductive caps;
wherein the first conductor channel extends through the separation layer, and wherein the first conductive caps selectively deposited on non-recessed first conductor channels;
wherein the first conductive cap is a stop layer between the first deck and the second deck, to interconnect the second conductor channel of the second deck to the first conductor channel of the first deck; and a touchscreen display coupled to generate a display based on data accessed from the memory device.

10. The electronic device of claim 9, wherein the first and second conductive caps comprises selectively deposited metal, metal oxide, or metal silicide.

11. The electronic device of claim 9, wherein the first and second conductive caps comprises a layer selectively deposited into a recess on the conductor channel.

12. A method comprising:
creating a source conductor layer on a semiconductor substrate;
creating a first deck of multiple tiers of circuit elements stacked adjacent each other, each tier including a circuit element activated via a gate;
creating at least one first conductor channel extending through the deck, the first conductor channel to electrically couple the gates of the circuit elements to the source conductor; and
depositing a first conductive cap on each conductor channel, the first conductive caps forming an ohmic contact with respective first conductor channels, each first conductive cap formed on each first conductor channel in openings in a separation layer, without generating polishing artifacts in the first conductive caps and separation layer;
creating a bitline to ohmically contact the first conductor channel via the first conductive cap; and
creating a second deck, including creating second multiple tiers of circuit elements, creating second conductor channels, and depositing second conductive caps;
wherein the first conductive cap is a stop layer between the first deck and the second deck, to interconnect the second conductor channel of the second deck to the first conductor channel of the first deck.

13. The method of claim 12, wherein creating the first and second conductive caps comprises selectively depositing metal.

14. The method of claim 12, wherein depositing the first and second conductive caps comprises selectively depositing conductive material into an etched recess on the conductor channel.

15. The method of claim 12, wherein the first conductor channels extend through the separation layer, and wherein depositing the first conductive caps comprises selectively depositing mushroom caps on the first conductor channels.

16. The method of claim 12, wherein creating the first and second conductive caps comprises selectively depositing metal oxide.

17. The method of claim 12, wherein creating the first and second conductive caps comprises selectively depositing metal silicide.

18. The method of claim 12, wherein creating the first conductive caps comprises selectively depositing a layer of material into recesses on the first conductor channels.

* * * * *